United States Patent [19]

Ishino et al.

[11] Patent Number: 4,972,191

[45] Date of Patent: Nov. 20, 1990

[54] WAVE ABSORBER, AND AN ANECHOIC CHAMBER USING THE SAME

[75] Inventors: Ken Ishino, Chiba; Taro Miura, Tokyo; Takashi Watanabe; Masashi Katsumata, both of Chiba, all of Japan

[73] Assignee: TDK Corporation, Tokyo, Japan

[21] Appl. No.: 385,593

[22] Filed: Jul. 24, 1989

[30] Foreign Application Priority Data

Jul. 26, 1988 [JP] Japan .................................. 63-184731

[51] Int. Cl.⁵ .............................................. H01Q 17/00
[52] U.S. Cl. ............................................................ 342/1
[58] Field of Search ................................................. 342/1

[56] References Cited

U.S. PATENT DOCUMENTS 2,594,971  4/1952  Moullin ..................................... 342/1
3,737,903  6/1973  Suetake et al. ........................... 342/1

FOREIGN PATENT DOCUMENTS 55-47479  11/1980  Japan ..................................... 342/1

Primary Examiner—Gilberto Barrón, Jr.
Attorney, Agent, or Firm—Armstrong, Nikaido Marmelstein, Kubovcik & Murray

[57] ABSTRACT

A flat wave absorber having a conductive plate, a dielectric plate on the conductive plate, and, a ferrite plate on said dielectric plate, provides a wide operational frequency range from 30 MHz to 1 GHz with excellent attenuation characteristics, and an anechoic chamber mounting said wave absorber on inside surface of the chamber is provided. Thickness of said dielectric plate is less than 25 mm, the thickness of said ferrite plate is less than 7.5 mm, and real part of complex impedance of said ferrite plate on the conductive plate is less than 1.0 and close to 1.0. Said ferrite plate is attached to said dielectric plate in the form of tiles.

13 Claims, 6 Drawing Sheets

WAVE ABSORBER, AND AN ANECHOIC CHAMBER USING THE SAME

BACKGROUND OF THE INVENTION

The present invention relates to a wave absorber having a ferrite tile on a dielectric plate, and an anechoic chamber which mounts such an absorber inside the chamber.

Since a digital IC (integrated circuit) has been used in the control circuit of consumer electronics apparatus, a sophisticated control has become possible with simple structure and low cost. A MOS IC is essential in said consumer electronics apparatus.

However, noise generated by a digital apparatus, and characteristics for noise of a digital apparatus, have become significant problems. Therefore, a test of an electronic apparatus for noise has become important, and an anechoic chamber becomes necessary for that test.

Conventionally, noise radiated by an electronics apparatus is measured at an outside test place called an open site, which has; a conductive floor, a turntable which carries an apparatus to be tested, a dipole receive antenna mounted on a lift, and a receiver. The three meter method, in which the distance between a test apparatus and a receive antenna is three meters, is usually used for a test of a small electronics apparatus like a personal computer. In other cases, the 10 meters method or one meter method is also used.

However, an outside test has the following problems.

(a) When low environmental noise is desired, we must install a test apparatus far away from highly populated or unban areas.

(b) Since undesired environmental noise is not constant, it is difficult to separate noise generated by a test apparatus from undesired environmental noise. It needs some experience to separate these noises.

(c) The test is influenced by weather, and the test is not easy when the weather is bad, or in mid-summer and/or in mid-winter.

(d) Further, because of legal reasons, it is impossible during testing to radiate high power to determine the noise characteristics of a test sample.

An anechoic chamber which has a wave absorber inside has been used for solving the above problems of an outside test. More than 10 anechoic chambers have been filed at the FCC in the USA as authorized test chambers.

An anechoic chamber must be a shielded chamber enclosed by conductors in order to prevent external environmental noise and further, that chamber must have wave absorbers on the inside walls and ceilings for absorbing electromagnetic waves radiated inside the chamber.

Preferably, the wave absorber mounted in an anechoic chamber must attenuate the radiated energy by 15-20 dB in the frequency range 30 MHz-1 GHz (1000 MHz).

A prior typical wave absorber is in the shape of a pyramid with dielectric material mixed with carbon. However, that structure has the disadvantage that the necessary height of a pyramid must be 3-3.5 meters for covering 30 MHz-1 GHz, and that thick wave absorber would make the available test space in the chamber extremely limited.

Another prior wave absorber is the combination of a ferrite tile and said pyramid structure. However, even in that structure, the height of the pyramid must be still 1.0-1.5 meters, and the thickness of the wave absorber must be smaller to provide much test space in a chamber. Further, ferrite material operates as a resonant type absorber with the frequency band of the absorber being rather narrow, although the attenuation at the resonant frequency is large.

Another prior wave absorber has three layers having a ferrite layer sandwiched between a pair of dielectric layers, and that structure has been used on outside walls of a tall building for preventing ghost images on a television screen. That three-layer structure can absorb about 20 dB in the frequency range 100 MHz-350 MHz. Although that three-layer structure has the advantage that the thickness is small (8-10 mm), it has the disadvantage that the frequency range is still not enough. In our experience, the presence of a dielectric layer on a ferrite layer deteriorates the attenuation in high frequency, although that dielectric layer improves the attenuation in low frequency. Therefore, the three-layer structure is not preferable for a wave absorber of wide frequency band up to 1 GHz.

SUMMARY OF THE INVENTION

It is an object of the present invention to provide a new and improved wave absorber by overcoming the disadvantages and limitations of a prior wave absorber.

It is another object of the present invention to provide a wave absorber which is thin, and provides enough attenuation in the frequency range 30 MHz-1 GHz.

It is stll another object of the present invention to provide an anechoic chamber which mounts such a wave absorber.

The above and other objects are attained by a wave absorber comprising; a conductive plate; a flat dielectric plate of a predetermined thickness attached on said conductive plate, a flat ferrite plate of a predetermined thickness attached on said dielectric plate.

Another feature of the present invention resides in an anechoic chamber which is enclosed by a conductive layer for electro-magnetic shielding purposes, and is mounted in said wave absorber inside of the chamber.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
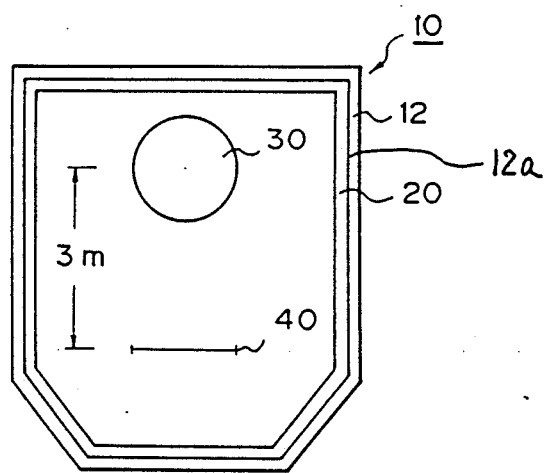
FIG. 1 is a plane view of an anechoic chamber according to the present invention.

FIG. 1 shows a plane view of an anechoic chamber 10 according to the present invention. In the figure, the numeral 12 is a wall of the chamber. The chamber 10 is usually completely enclosed by a conductive layer for the purpose of the electro-magnetic shielding effect including the ceiling, walls and floor of the chamber. In the embodiment, the conductive layer 12a is attached inside of the wall 12. Alternatively, both the inside surface and the outside surface of the wall are coated with the conductive layers, or only the outside surface may be coated with the conductive layers.

The shielding effect of the chamber is higher than 70 dB, and preferably it is about 90 dB. In other words, environmental noise is attenuated by 90 dB inside of the chamber, and the inside radiation is attenuated by 90 dB outside of the chamber.

The numeral 20 is a wave absorber, which is attached on the wall 12. In one embodiment, the wave absorber 20 is attached on all the surfaces of the wall 12 and the ceiling of the chamber 10, including the doors (not shown). Usually, the wave absorber 20 is not attached on the floor of the chamber 10, but of course it may be possible to attach the wave absorber 20 on the floor.

It should be appreciated that the chamber which has no wave absorber on the floor can provide measurement results close to that of an open site, than the chamber which has a wave absorber also on a floor.

The numeral 30 is a turn table which carries a test sample which radiates electro-magnetic waves. The numeral 40 is a receive antenna which receives waves from the test sample 30. The length between the center of the turntable 30 and the antenna 40 is 3.0 meters in the three-meter method. That length is 10 meters in the ten-meter method, or one meter in the one-meter method.

It should be noted that the wave absorber 20 is flat and thin in the present invention. That flat wave absorber is the feature of the present invention.

Figure 2A:
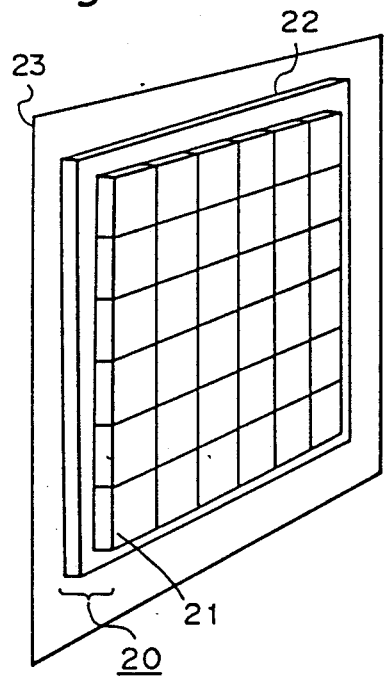
FIG. 2A is a perspective view of the wave absorber according to the present invention.
Figure 2B:
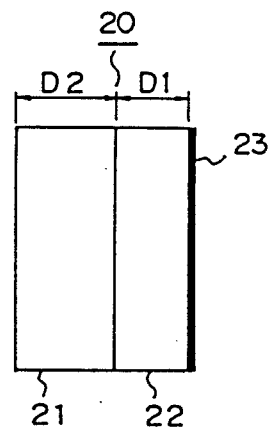
FIG. 2B is a cross section of the wave absorber of FIG. 2A.

FIG. 2A shows the perspective view of the wave absorber 20 according to the present invention, and FIG. 2B is the cross section of the wave absorber 20.

As shown in the figures, the wave absorber of the present invention has a conductive plate 23, a flat dielectric plate 22 attached on the conductive plate 23, and a flat ferrite plate 21 attached on said dielectric plate 22. The thickness of the dielectric plate is supposed to be D1, and the thickness of the ferrite is supposed to be D2. The ferrite plate 21 is attached in the form of tiles with a predetermined size as shown in FIG. 2A.

The two-layer structure of the dielectric plate 22 and the ferrite plate 21 on the conductive plate 23 is the important feature of the present invention.

In a preferred embodiment, the conductive plate 23 of the wave absorber can double as the conductive plate 12a for the shield effect of the chamber 10. In that case, no specific conductive plate 23 is used. The dielectric plate 22 and the ferrite plate 21 are attached directly on the conductive plate 12a of the shield chamber. The conductive plate may be iron for the building material.

Further, in a further preferred embodiment, the dielectric plate 22 may by provided by the wall itself which is made of dielectric material, like plaster board, or a glass fiber FRP (fiber resin plastics) board. In that case, the chamber 10 is enclosed by the outside conductive layer (not shown) attached on the outside of the dielectric wall 12, and the roof (not shown), and the ferrite plate 21 is attached on the dielectric plate inside of the chamber. The dielectric plate is made of concrete, resin concrete, glass fiber FRP (fiber resin plastics), a plaster board, or other building materials.

Figure 3:
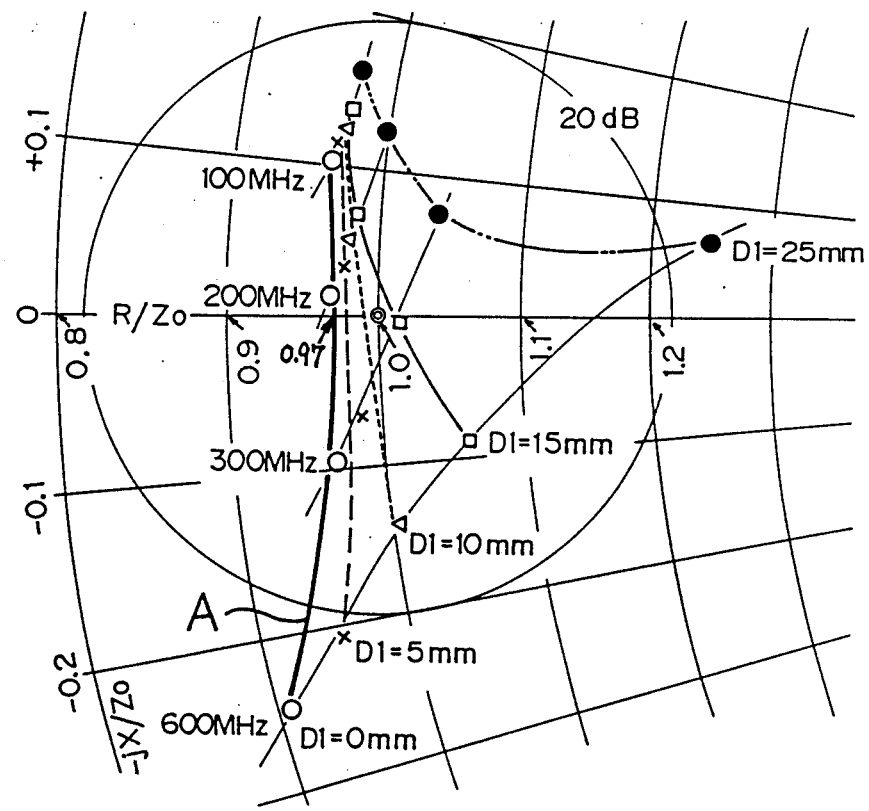
FIG. 3 is a part of the Smith chart for the explanation of the operation of the wave absorber of the present invention.

FIG. 3 shows the Smith chart showing the operation of the wave absorber which has a ferrite plate and a dielectric plate on a conductive plate according to the present invention.

The curve A in FIG. 3 shows the characteristics of the case D1=0 where no dielectric plate is used. In that case, the ferrite plate attached on the conductive board directly has the characteristics that the real part of the impedance (resistance component) is close to 1.0 and a little smaller than 1.0. A ferrite wave absorber having said characteristics that the real part of the impedance is close to 1.0 and a little smaller than 1.0 is useful to provide high attenuation in low frequency. The real part in the curve A is 0.97 in the embodiment, and it is preferable that the real part is higher than 0.9 and smaller than 1.0. The curve A in FIG. 3 shows that the frequency range for providing the attenuation 20 dB is 50 MHz–400 MHz, which is not enough for covering 30–1000 MHz.

When a dielectric plate is inserted between a ferrite plate and a conductive plate, the impedance trace on the Smith chart shifts to so-called lateral direction from the vertical curve A, depending upon the thickness of the dielectric plate.

Generally speaking, when a dielectric plate is inserted between a ferrite plate and a conductive plate, the attenuation in high frequency is improved, but the attenuation in low frequency is deteriorated. On the other hand, when a dielectric plate is attached on a ferrite plate which is attached on a conductive plate, the attenuation in low frequency is improved and the attenuation in high frequency is deteriorated. As the present wave absorber must operate in the frequency range 30 MHz–1000 MHz, the attenuation in low frequency must not be deteriorated, and no dielectric plate must be attached to a ferrite plate.

Therefore, the basic idea of the present wave absorber for providing the attenuation in the frequency range from 30 MHz to 1000 MHz is that (1) a dielectric plate is inserted between a ferrite plate and a conductive plate for improving the attenuation in high frequency, (2) no dielectric plate is attached on a ferrite plate so that the attenuation in high frequency is not deteriorated, and (3) a ferrite material having the real part of the impedance close to 1.0 and less than 1.0 is used in order to improve the attenuation in low frequency.

FIG. 3 shows that the suitable thickness (D1=10 mm, or D1=15 mm) of a dielectric plate between a ferrite plate and a conductive plate can provide the attenuation higher than 20 dB for the frequency higher than 600 MHz. When the desired attenuation is 20 dB, the thickness D1=5 mm, or D1=25 mm is not used for the frequency range 30–1000 MHz. However, when the desired attenuation is 15 dB, the thickness D1=5 mm, or D1=25 mm satisfies the required frequency range.

Figure 4A:
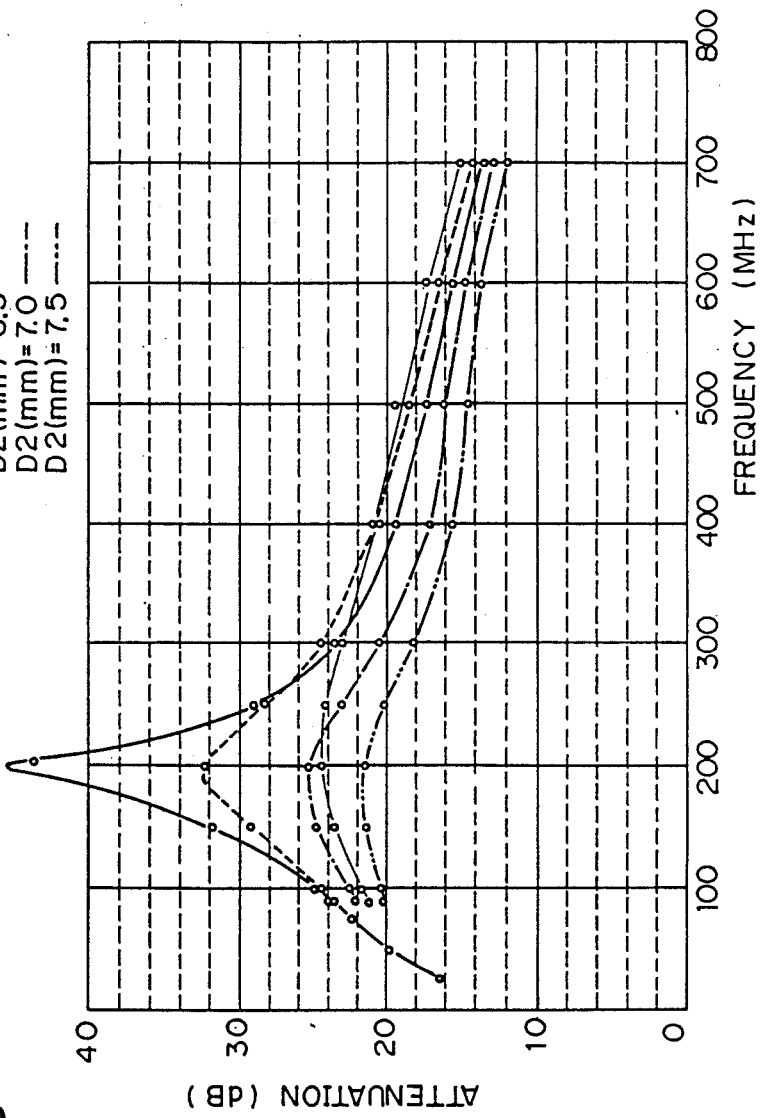
FIGS. 4A through 4C show the attenuation characteristics of the wave absorbers.
Figure 4B:
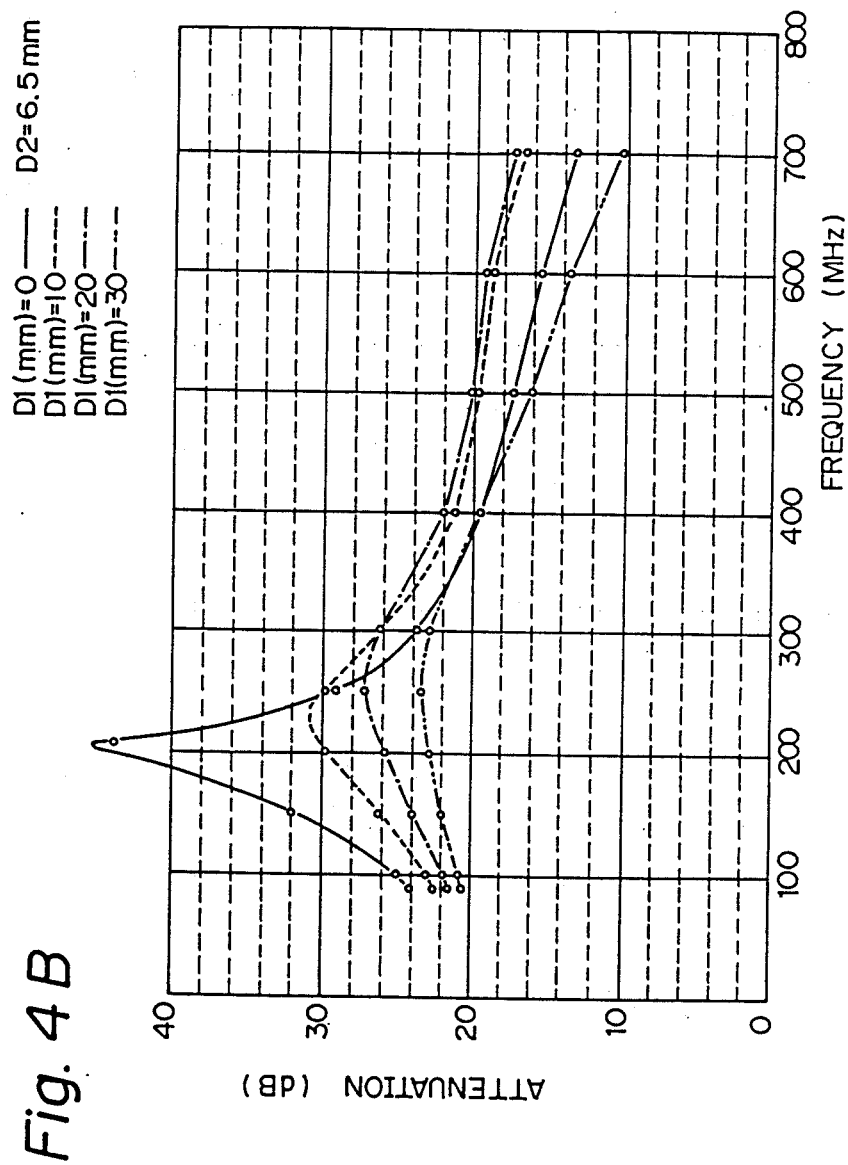
Figure 4C:
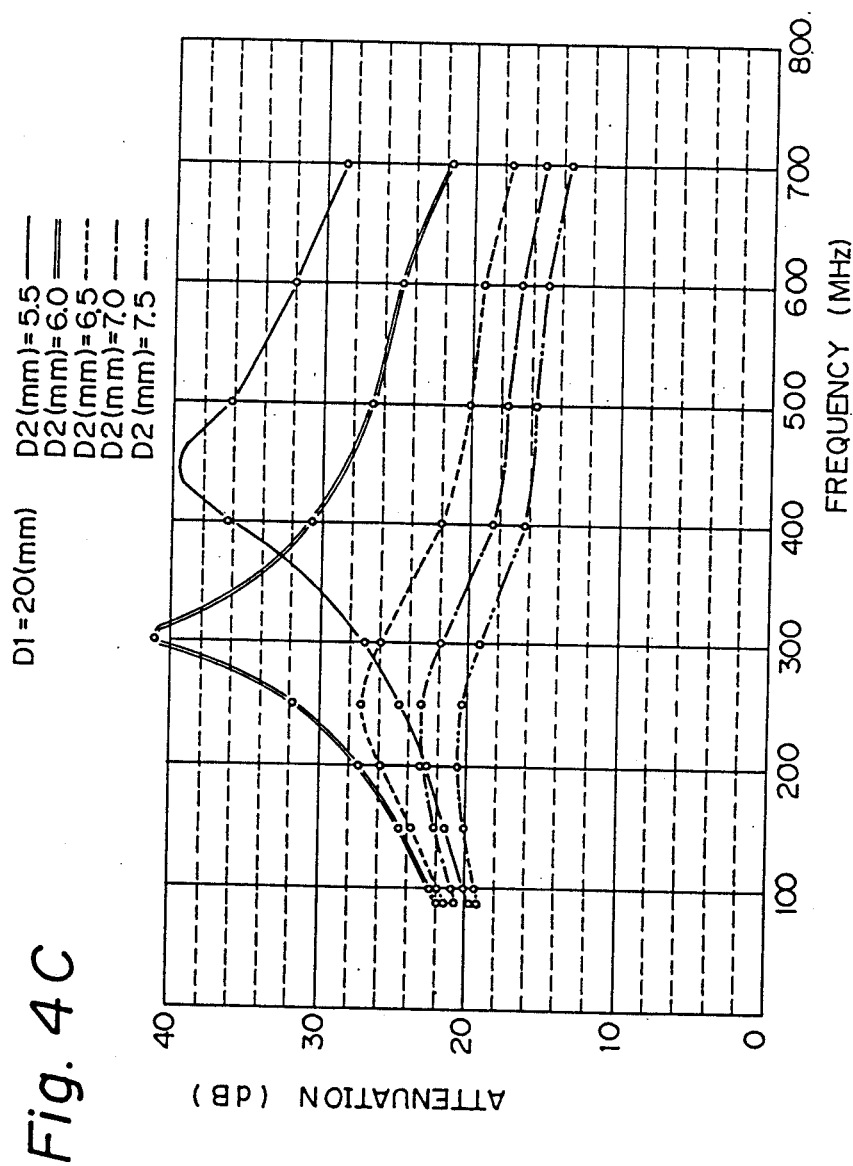

FIGS. 4A, 4B and 4C show the experimental curves showing the attenuation of the wave absorber. In those figures, the horizontal axis shows the frequency in MHz, and the vertical axis shows the attenuation in dB.

FIG. 4A shows the curves when D1=0 (no dielectric plate is used between a ferrite plate and a conductive plate) for each thickness D2 of a ferrite plate from D2=5.5 mm to D2=7.5 mm.

As a ferrite wave absorber is a resonant type absorber, the curves have resonant frequency around 200 MHz, and the attenuation decreases in high frequency.

As the attenuation in high frequency is improved by inserting a dielectric plate between a ferrite plate and a conductive plate, the curves of FIG. 4A (D2=5.5–7.5 mm) are satisfactory for providing the attenuation higher than 15 dB. With that thickness, the preferable range for the practical embodiment is in the range from D2=5.5 mm to D2=6.5 mm, as apparent in the figure.

FIG. 4B shows the attenuation curves when the thickness D2 of a ferrite plate is fixed to D2=6.5 mm, for each thickness D1 of a dielectric plate, where the dielectric plate is concrete which has the relative dielectric constant $\epsilon=4$ in the embodiment. As shown in FIG. 4B, the attenuation when D1=0 or D1=30 mm, does not reach 15 dB in 700 MHz, but the attenuation when D1=10 mm or D1=20 mm is satisfactory in high frequency. So, the preferable thickness of a dielectric plate is in the range from 5 mm to 25 mm.

As shown in FIG. 4B, the larger the thickness of the dielectric plate is the higher the resonant frequency and the wider the frequency band, although the maximum attenuation is lower. The relationships between the thickness of the dielectric plate, and the resonant frequency, the frequency band, or the maximum attenuation do not change considerably even when the relative dielectric constant changes. When the dielectric constant is large, the change of the thickness changes much of the characteristics of the wave absorption.

FIG. 4C shows the curves of the attenuation when the thickness D1 (dielectric plate which is concrete having the dielectric constant $\epsilon=4$)- is fixed to D1=20 mm, for each thickness of D2 of a ferrite plate. As shown in FIG. 4C, the attenuation is higher than 20 dB for all the frequency band when D2=5.5 mm and D2=6.0 mm. As for D2=6.5 mm, the attenuation in high frequency does not reach 20 dB, but is higher than 15 dB. So, D2=6.5 mm is satisfactory when the desired attenuation is 15 dB. The samples of D2=7.0 mm and D2=7.5 mm are also satisfactory although the attenuation in high frequency is a little lower than 15 dB. So, those samples of D2=7.0 mm and D2=7.5 mm are used when the desired attenuation is 10 dB.

In the above experimental results, the preferable thickness D2 of a ferrite plate is in the range from D2=5.5 mm to D2=7.5 mm, and the most preferable range is from D2=5.5 mm to D2=6.5 mm.

The preferable thickness D1 of a dielectric plate is in the range from D1=5 mm to D1=25 mm, and the most preferable range is from D1=10 mm to D1=20 mm.

Figure 5A:
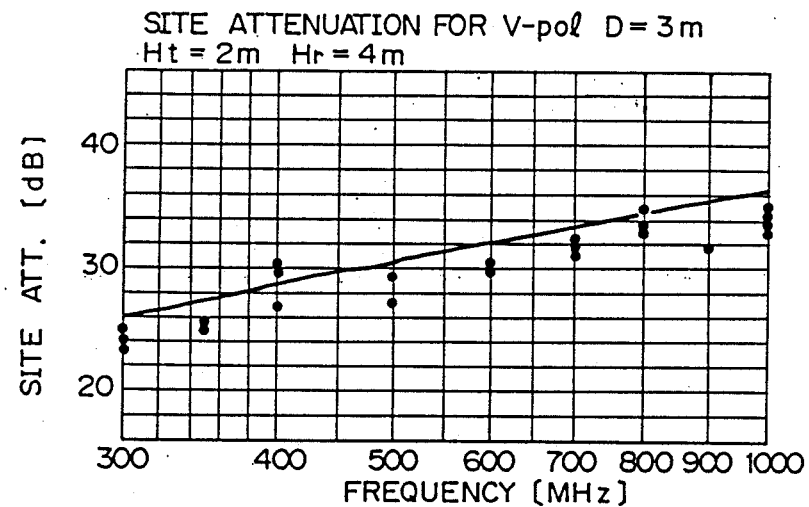
FIGS. 5A and 5B show the site attenuation characteristics of the wave absorber of the present invention.
Figure 5B:
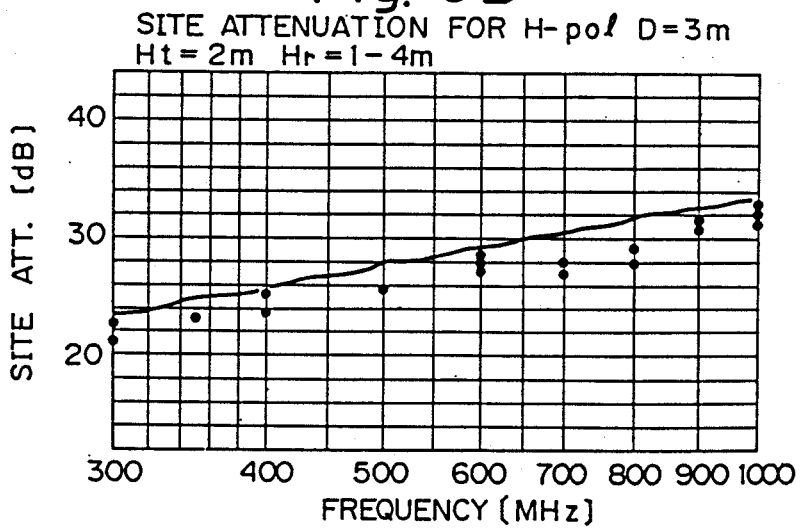

FIG. 5 shows the experimental curves of the site attenuation in high frequency band (300–1000 MHz) of the present anechoic chamber which attaches the present wave absorber. In the figure, the horizontal axis shows the frequency in MHz, and the vertical axis shows the site attenuation in dB, and the solid line shows the theoretical curve, and the dots show the experimental results. The site attenuation is defined so that when a transmitter is placed at the height of two meters, and a receive antenna is moved between the heights of one meter to four meters, the maximum receive level is plotted. FIG. 5A shows the site attenuation for the vertical polarization wave, and FIG. 5B shows the site attenuation for the horizontal polarization wave. The spacing between a sample and a receive antenna is three meters. As shown in those figures, the experimental plots coincides well with the theoritical curves.

From the foregoing it will now be apparent that a new and improved wave absorber and an anechoic chamber using that wave absorber has been found. It should be understood of course that the embodiments disclosed are merely illustrative and are not intended to limit the scope of the invention. Reference should be made to the appended claims therefore, rather than the specification as indicating the scope of the invention.

What is claim is:

1. A wave absorber comprising:
   a conductive plate;
   a flat dielectric plate of a predetermined thickness attached on said conductive plate,
   a flat ferrite plate of a predetermined thickness attached to said dielectric plate,
   wherein the real part of complex impedance of said ferrite plate, as measured when said ferrite plate is attached on a conductive plate, is in a range between 0.9 and 1.0.

2. A wave absorber according to claim 1, wherein thickness of said ferrite plate is in the range between 5.5 mm and 7.5 mm.

3. A wave absorber according to claim 1, wherein thickness of said dielectric plate is in the range between 5 mm and 25 mm.

4. A wave absorber according to claim 1, wherein said dielectric plate is made of concrete.

5. An anechoic chamber having a conductively closed structure with a floor, a ceiling and a wall which has at least one door, with at least the inner surface of said ceiling and said wall covered with a wave absorber which has a conductive plate, a dielectric plate attached on said conductive plate and a ferrite plate attached on said dielectric plate wherein the real part of complex impedance of said ferrite plate, as measured when said ferrite plate is attached on a conductive plate, is in a range between 0.9 and 1.0.

6. An anechoic chamber according to claim 5, wherein said conductive plate of the wave absorber doubles as a conductive layer for electromagnetic shielding of the chamber.

7. An anechoic chamber according to claim 5, wherein a conductive layer is attached outside of said ceiling and said wall for electro-magnetic shielding of the chamber.

8. An anechoic chamber according to claim 5, wherein said wave absorber is placed on the floor of the chamber.

9. An anechoic chamber according to claim 5, wherein said wave absorber is placed on all the inner surfaces of the chamber except on the floor of the chamber.

10. An anechoic chamber according to claim 5, wherein said dielectric plate is provided as the building material of the chamber.

11. An anechoic chamber according to claim 5, wherein said dielectric plate is made of concrete.

12. An anechoic chamber according to claim 5, wherein said dielectric plate is made of plaster board.

13. An anechoic chamber according to claim 5, wherein said dielectric plate is made of glass FRP.

* * * * *